(12) United States Patent
Moyer

(10) Patent No.: US 6,269,016 B1
(45) Date of Patent: Jul. 31, 2001

(54) MRAM CAM

(75) Inventor: William C. Moyer, Dripping Springs, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/597,362

(22) Filed: Jun. 19, 2000

(51) Int. Cl.$^7$ .............................. G11C 15/00; G11C 11/00
(52) U.S. Cl. .............................. 365/49; 365/158; 365/171
(58) Field of Search .............................. 365/49, 158, 148, 365/171, 173

(56) References Cited

U.S. PATENT DOCUMENTS

| | | | |
|---|---|---|---|
| 4,064,494 | 12/1977 | Dickson et al. | 365/49 |
| 5,173,873 | * 12/1992 | Wu | 365/173 |
| 5,343,422 | 8/1994 | Kung et al. | 365/173 |
| 5,748,519 | * 5/1998 | Tehrani | 365/98 |
| 5,852,574 | * 12/1998 | Naji | 365/171 |
| 5,917,749 | 6/1999 | Chen et al. | 365/173 |
| 5,920,500 | 7/1999 | Tehrani et al. | 365/173 |
| 6,097,625 | * 8/2000 | Scheuerlein | 365/171 |

OTHER PUBLICATIONS

Roy E. Scheuerlein, "Magneto–Resistive IC Memory Limitations and Architecture Implications", 1998 IEEE Int'l NonVolatile Memory Technology Conference, pp. 47–50.

* cited by examiner

*Primary Examiner*—Son Mai

(57) ABSTRACT

An integrated circuit (IC) magnetic random access memory (MRAM) content addressable memory (CAM) system has a CAM cell which includes a first data bit and a second data bit, both of which are MRAM cells. The CAM is written by providing a word write current and writing the first and second data bits. The first and second data bits are written by currents that are flowing in different directions. After initializing the equalization bit, an input bit in one state indicates that the first and second data bits are written in first and second directions, respectively. The input bit in another state indicates that the first and second bits are written in the second and first directions, respectively.

10 Claims, 3 Drawing Sheets

MRAM CAM

FIELD OF THE INVENTION

The present invention relates to integrated circuit (IC) magnetic random access memory (MRAM) systems, and, more specifically, to an IC MRAM system configured as a Content Addressable Memory (CAM).

BACKGROUND OF THE INVENTION

Although during the Fifties and Sixties magnetic core memories were the predominant storage technology for the working memory of computing systems, they were rapidly supplanted during the Seventies by the integrated circuit random access memory, both static (SRAM) and dynamic (DRAM). The advantages of these newer technologies are well known: microscopic size (contributing to higher operating speeds), miniscule power requirements (requiring dissipation of less waste heat), improved robustness and thus reliability, and manufacturing efficiencies of scale—all of which contributed to the dramatically reduced cost per bit. The disadvantages are equally well known: data volatility, reflected as continuous power dissipation in SRAMs, and as periodic data refresh in DRAMs. To address these problems, various types of non-volatile, read/write memory technologies have been developed, including electrically erasable programmable read only memory (EEPROM), of which Flash memory is, at present, the most popular. All such technologies, however, have additional disadvantages, including finite lifetimes (in terms of write cycles), and power supply requirements which challenge designers of battery powered systems.

Recently, magnetoresistive random access memory (MRAM) cells suitable for fabrication using current integrated circuit manufacturing processes have been developed for use as non-volatile storage elements. Examples of such an MRAM cell suitable for implementation in an IC are shown and described in U.S. Pat. Nos. 5,343,422, 5,917,749, and 5,920,500. A survey of current MRAM technologies and their relative advantages and disadvantages was published by R. Scheuerlein in "Magneto Resistive IC Memory Limitations and Architecture Implications", 1998 International NonVolatile Memory Technology Conference, IEEE, pp. 47–50 (1998).

In general, MRAM devices of the Magnetic Tunnel Junction (MTJ) type include a multi-layer resistor element comprised of suitable magnetic materials which change its resistance to the flow of electrical current depending upon the direction of magnetic polarization of the layers. In a memory cell, this "bit_resistor" is connected in series with a "bit_read" transistor between a common voltage supply and a "bit read_write" conductor connected to an input of a "read" sense amplifier. A "word_write" conductor is arranged to intersect, relatively orthogonally, the bit_read_write conductor. The word_write and the bit_read_write conductors are connected to respective word_write and bit_write driver circuits which are selectively enabled such that each conductor conducts only a portion of the current necessary to switch the polarization state of the bit_resistor.

During a write operation, each of these "write" currents is individually insufficient to affect the polarization state of any bit_resistor, but, together, at the point of intersection or "coincidence", the currents are sufficient to affect the polarization state of that bit_resistor which is proximate to the intersection of the write conductors. Depending upon the present state of polarization and the relative directions of current flow in the write conductors, the bit_resistor at the coincidence point will either maintain or switch its polarization state.

During a read operation, the bit_read transistor is enabled via a respective word_read conductor, and, simultaneously, the corresponding bit_read sense amplifier is enabled to create a current path from the bit_read_write conductor to the common supply. Since the difference in the resistance value of the bit_resistor is small, the bit_read sense amp must be sufficiently sensitive to recognize the small differences in voltage drop across the bit_resistor associated with the respective polarization states. As was the case with magnetic core memories, an MRAM bit_resistor, once written, will retain its magnetic polarization state indefinitely, with no further input of power. Similarly, there appears to be no practical limit on the number of times that the polarization of the bit_resistor itself can be switched or "written".

In U.S. Pat. No. 4,064,494, a Content Addressable Memory (CAM) is disclosed in which each CAM cell is comprised of a pair of non-volatile storage devices, preferably of the non-destructive read-out (NDRO) type, such as floating-gate MNOS transistors. Although reference is made to "plated wire" ('494: col. 1, line 65), the detailed description and drawings are limited to MNOS embodiments, which require quite different write cycles than does a plated wire. As expected, no mention is made of MRAM devices, since such technology had not yet been invented. In any event, the write cycle described therein is inappropriate for an MRAM CAM, and, in general, the read, write and control circuitry are significantly different.

An object of the present invention is to provide an MRAM CAM.

In addition, the present invention is directed to suitable apparatus for practicing the method disclosed hereinafter.

BRIEF DESCRIPTION OF THE DRAWINGS

The present invention may be more fully understood by a description of certain preferred embodiments in conjunction with the attached drawings in which.

In the following descriptions of the preferred embodiments of the present invention, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE PREFERRED EMBODIMENTS

According to one aspect of the present invention, an integrated circuit (IC) magnetic random access memory (MRAM) content addressable memory (CAM) system has at least one CAM cell including a first data bit, comprised of a first MRAM cell which is writeable in a first logic state in response to a coincidence of a word_write current and a first bit_write current provided in a first direction, and in a second logic state in response to a coincidence of said word_write current and said first bit_write current provided in a second direction; and a second data bit, comprised of a second MRAM cell which is writeable in said first logic state in response to a coincidence of said word_write current and a second bit_write current provided in said first direction, and in said second logic state in response to a coincidence of said word_write current and said second bit_write current provided in said second direction. A method for writing said CAM cell, includes the steps of receiving an input bit having one of said first and second logic states; providing said word_write current; in response to receiving said input bit in said first logic state: providing said first bit_write current to said first MRAM cell in said first direction; and providing said second bit_write current to said second MRAM cell in said second direction. In response to receiving said input bit in said second logic state, the method provides said first bit_write current to said first MRAM cell in said second direction; and provides said second bit_write current to said second MRAM cell in said first direction.

Figure 1:
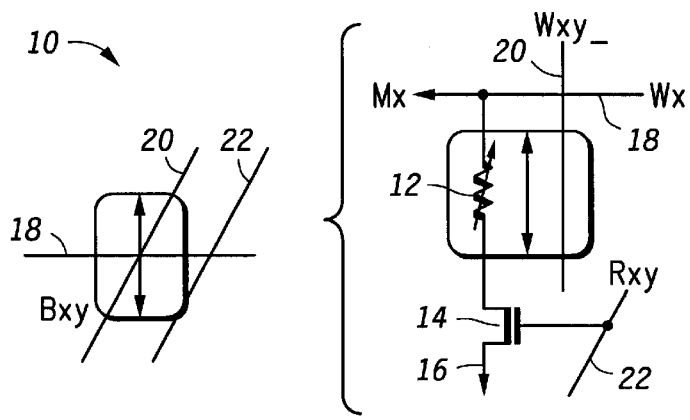
FIG. 1 illustrates in schematic diagram form a conventional magnetic random access memory (MRAM) cell, and the symbology used hereinafter to describe each of the several embodiments of the present invention.

In an IC MRAM cell 10, configured in accordance with the present invention as shown in FIG. 1, a bit_resistor 12 is connected in series with a bit_read transistor 14 between a common voltage supply 16 and a word_read_write conductor 18. A bit_write conductor 20 is arranged to intersect, relatively orthogonally, the word_read_write conductor 18. A bit_read conductor 22 is connected to the control gate of each bit_read transistor 14 in a word.

For convenience of reference, the symbol shown in the left portion of FIG. 1 will be used hereinafter whenever the cell illustrated in the right portion of FIG. 1 is instantiated in the MRAM CAM systems shown in FIGS. 2 and 4. In FIG. 1, the left end of the word_read_write conductor 18 has been labeled "Mx" to indicate that, for example, it provides a path for detecting a "match" of all bits of a multi-bit "word x", while the right end has been labeled "Wx_" to indicate that it also provides a path for the word_write current. Similarly, the bit_write conductor 20 and the bit_read conductor 22 have been labeled respectively "Wxy" and "Rxy", to reflect the nomenclature used hereinafter.

Figure 2:
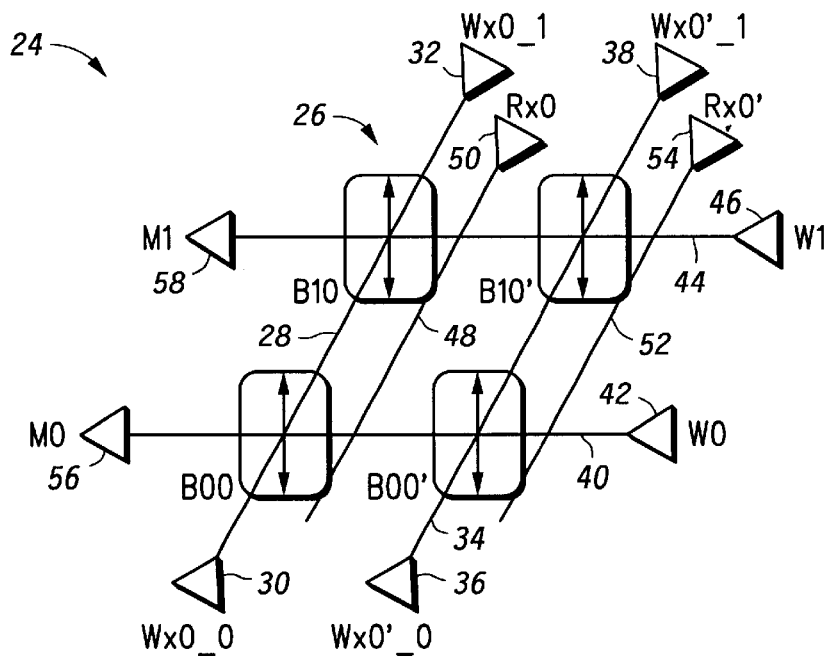
FIG. 2 illustrates in schematic diagram form an MRAM CAM system constructed in accordance with a first embodiment of the present invention.

Shown in FIG. 2, by way of example, is a MRAM CAM system 24 in which Four (4) instantiations of the MRAM cell 10 shown in FIG. 1 have been arranged to form an MRAM CAM array 26 comprising Two (2) CAM "words", "word_0" and "word_1", of which only CAM_0 cell is shown, each consisting of Two (2) data bits, each labeled in accordance with FIG. 1 to indicate the logical position of the respective MRAM cell 10 in the MRAM CAM array 26. In particular, a word_0_CAM_0 is comprised of a first MRAM cell 10, labeled "B00", representing a logical true bit_0 of word_0 CAM_0 and a second MRAM cell 10, labeled "B00'", representing a logical complement bit_0' of word_0_CAM_0; and a word_1_CAM_0 is comprised of a third MRAM cell 10, labeled "B 10", representing a logical true bit_0 of word_1_CAM_0 and a fourth MRAM cell 10, labeled "B10'", representing a logical complement bit_0' of word_1_CAM_0. A bit_0_ write conductor 28 is driven in a first direction by a bit_0_write_0 driver circuit 30, labeled "Wx0_0", and in a second, opposite direction by a bit_0_write_1 driver circuit 32, labeled "Wx0_1"; and a bit_0'_write conductor 34 is driven in a first direction by a bit_0'_write_0 driver circuit 36, labeled "Wx0'_0", and in a second, opposite direction by a bit_0'write_1 driver circuit 38. A word_0_read_write conductor 40 is driven by a word_0_write driver circuit 42, labeled "W0"; whereas a word_1_read_write conductor 44 is driven by a word_1_write driver circuit 46, labeled "W1".

During a write operation of, for example, word_0, the word_0_write driver circuit 42 (W0) is enabled to provide a word_0_write current via the word_0_read_write conductor 40. If a data value of logic_0 is to be written to, for example, word_0_CAM_0, the bit_0_write_0 driver circuit 30 (Wx0_0) will be enabled to provide a bit_0_ write_0 current via the bit_0_write conductor 28; simultaneously, the bit_0'_write_1 driver circuit 38 (Wx0'_1) will be enabled to provide a bit_0'_ write 1 current via the bit_0'_write conductor 34. Each of these write currents is individually insufficient to affect the polarization states of the B00 and B00' cells, but, together, the "coincidence" currents are sufficient to force the B00 cell to a predetermined one of the two polarization states, e.g., a logic_0, and the B00' cell to the opposite of the two polarization states, i.e., a logic_1. Depending upon the present state of polarization and the relative directions of current flow in the write conductors, the cells will either maintain or switch polarization states. If, on the other hand, a data value of logic_1 is to be written to, for example, word_0_CAM_0, the bit_0_write_1 driver circuit 32 (W0_1) will be enabled to provide a bit_0_write_1 current via the bit_0_write conductor 28, so that the logic state of B00 will be a logic_1; and the bit_0'_write_0 driver circuit 36 will be enabled to provide a bit_0'_write_0 current via the bit_0'_write conductor 34, so that the logic state of B00' will be logic_0. By selectively enabling the bit_write drivers so that the direction of the bit_0'_write current in the bit_0'_write conductor 34 is opposite the direction of the bit_0_write current in the bit_0_write conductor 28, the logic state of the B00' cell will always be the complement of the logic state in the B00 cell.

Continuing with the MRAM CAM system 24 of FIG. 2, a bit_0_read conductor 48 is driven by a bit_0_read driver circuit 50, labeled "Rx0"; while a bit_0'_read conductor 52 is driven by a bit_0'_read driver circuit 54, labeled "Rx0'". During a match operation, a selected one of the bit_0_read driver circuit 50 and the bit_0'_read driver circuit 54 will be enabled, depending upon the logic state of an input bit_0. If, for example, the input bit_0 has a logic_0 state, then the bit_0'_read driver circuit 54 will enable the B00' cell to shunt current between the common supply and the word_0_read_write conductor 40, while the B10' cell shunts current between the common supply and the word_1_read_write conductor 44. Simultaneously, a word_0_sense_amplifier 56 is enabled to detect the relative level of the shunt current on the word_0_read_write conductor 40, and a word_1_sense_amplifier 58 is enabled to detect the relative level of the shunt current on the word_1_read_write conductor 44. Since the difference in the resistance values of each bit_resistor 12 is small, the sense amps must be sufficiently sensitive to recognize the small differences in voltage drop across each bit_resistor 12 associated with the respective polarization states. In similar fashion, a logic_1 input bit_0 will enable the bit_0_read driver circuit 50 to simultaneously "match" the input bit_0 against the logic states of data bits B00 and B10. In a real instantiation of the MRAM CAM system 24, an "entry x" of "width y" will consist of a dedicated row x comprised of y bit cell pairs, Bxy and Bxy', arranged as shown in FIG. 2. Since each bit of the input word to be matched against is applied simultaneously to the respective bit of all CAM entries, only a single read cycle is required to perform the match. In the event that one of the entries "matches" the input word, the current flow on that word's read_write conductor will be distinctive.

Figure 3:
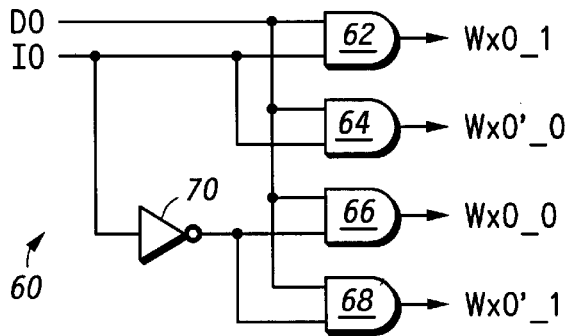
FIG. 3 illustrates in logic diagram form control logic for controlling the MRAM CAM system of FIG. 2 in performing a write operation in accordance with the present invention.

Shown in FIG. 3 is a control circuit 60 constructed in accordance with the first embodiment of the present invention to control the operation during a write cycle of the bit_write driver circuits of the MRAM CAM system 24 of FIG. 2. In operation, a write of, for example word_1 (W1) enables a set of Four (4) AND gates (AND 62, AND 64, AND 66 and AND 68) to select for output either I0 or the inverse thereof provided by an inverter 70. Thus, for example, if I0 is a logic_0, AND 66 will enable the bit_0_write_0 driver circuit 30 (Wx0_0) to write a logic_0 into B10, and AND 68 will enable the bit_0'_write_1 driver circuit 38 (Wx0'_1) to write a logic_1 into B10'; whereas if, instead, I0 is a logic_1, AND 62 will enable the bit_0_write_1 driver circuit 32 (Wx0_1) to write a logic_1 into B10, and AND 64 will enable the bit_0'_write_0 driver circuit 36 (Wx0'_0) to write a logic_0 into B10'.

Figure 4:
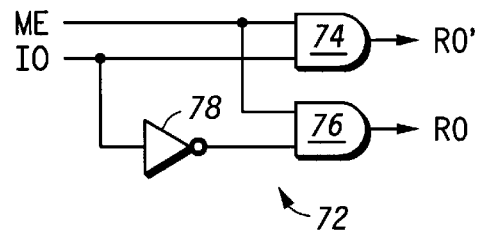
FIG. 4 illustrates in logic diagram form control logic for controlling the MRAM CAM system of FIG. 2 in performing a match operation in accordance with the present invention.

Shown in FIG. 4 is a control circuit 72 constructed in accordance with the first embodiment of the present invention to control the operation of the MRAM CAM system 24 during a match operation. In operation, a match enable signal ("ME") will enable a pair of AND gates (AND 74 and AND 76), configured as a 2-to-1 multiplexer, to provide either I0 or the inverse thereof provided by an inverter 78. Thus, for example, if I0 is a logic_1, AND 74 will enable the bit_0'_read driver circuit 54 (Rx0) to read B00' and B10'; whereas, if I0 is a logic_0, AND 76 will enable the bit_0_read driver circuit 50 (Rx0) to read B00 and B10.

Figure 5:
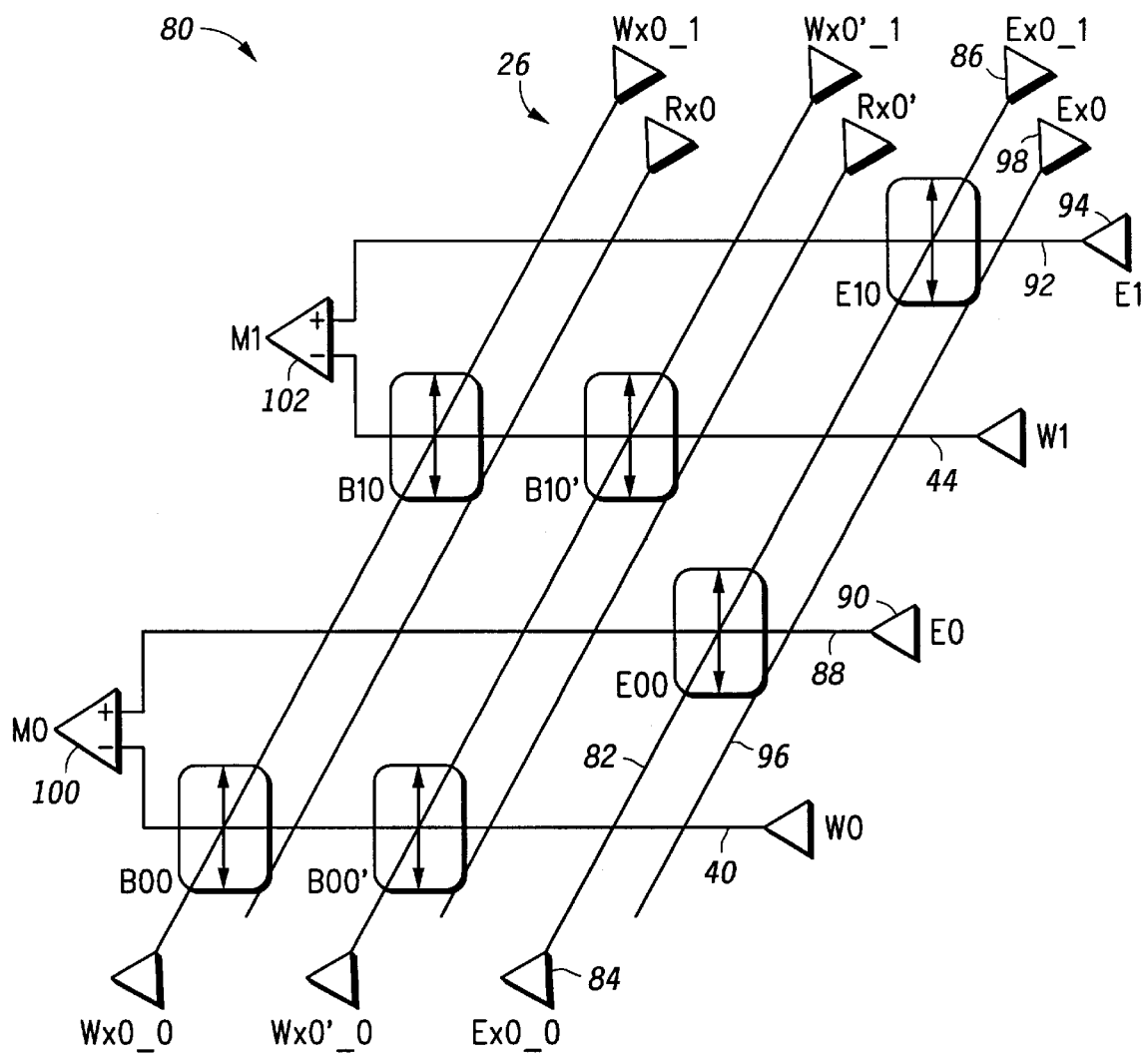
FIG. 5 illutrates in schematic diagram form an MRAM CAM system constructed in accordance with a second embodiment of the present invention.

Shown in FIG. 5 is an MRAM CAM system 80, constructed in accordance with a second embodiment of the present invention to have balanced sense lines. In particular, each CAM cell in the MRAM CAM array 26 includes an equalization MRAM cell 10, and the appropriate read and write circuitry, and each of the sense amps has differential inputs. For example, word_0_bit_0 includes an equalization MRAM cell 10, labeled "E00", and word_1_bit_0 includes an equalization MRAM cell 10, labeled "E10. An E_bit_0_write conductor 82 is driven in a first direction by an E_bit_0_$_{write\_}$0 driver circuit 84, labeled "Ex0_0", and in a second, opposite direction by an E_bit_0_write_1 driver circuit 86, labeled "Ex0_1". A word_0_equalization conductor 88 is driven by a word_0_equalization driver circuit 90 labeled "E0"; whereas a word_1_equalization conductor 92 is driven by a word_1_equalization driver circuit 94, labeled "E1".

During an initialization procedure, each of the equalization cells is programmed to a high resistance state (using the same procedure used to program the other bit cells, discussed above with respect to FIGS. 2, 3 and 4) and thereafter never changed. Even though only one of the write_0 and write_I driver circuits is required for this initialization procedure, both may be provided, as shown in FIG. 5, to facilitate full testing and validation of the entire MRAM CAM system 80 at any time. Since the polarization states of the equalization cells is determined prior to actual use in a CAM application, the following discussion will assume that each such equalization cell will always be in the high resistance state.

Continuing with the MRAM CAM system 24 of FIG. 5, an E_bit_0_read conductor 96 is driven by an E_bit 0_read driver circuit 98 labeled "Ex0". During, a match operation, otherwise as described above, the E_bit_0_read driver circuit 98 will be enabled (for example, by the match enable (ME) signal, or, perhaps, a simple logical OR (not shown) of the Rx0 and Rx0' signals shown in FIG. 4). In response, all Ex0 cells will shunt current between the common supply and the respective equalization conductors. Simultaneously, a word_0_differential_sense_amplifier 100 is enabled to detect the relative level of the shunt currents on the word_0_read_write conductor 40 and the word_0_equalization conductor 88; and a word_1_ differential_sense_amplifier 102 is enabled to detect the relative level of the shunt currents on the word_1_read_ write conductor 44 and the word_1_equalization conductor 92.

Since each bit_resistor 12 has substantially the same high and low resistance values (within known ranges), the sense amps will always "see" a high resistance load on the respective equalization conductor, whereas the resistance load on the associated read_write conductor will be high only if match is present between the logic value stored in the respective CAM cell and the corresponding input bit. Accordingly, the task of each differential sense amplifier is considerably simplified, since its inputs will differ significantly only if at least one of the bits of the word fail to match. In a real instantiation of the MRAM CAM system 80, an "entry x" of "width y" will consist of a dedicated row x comprised of y bit cell pairs, Bxy and Bxy' and a corresponding row comprised of y equalization bits, Exy, arranged as shown in FIG. 5. Since each bit of the input word to be matched against is applied simultaneously to the respective bit of all CAM entries, only a single read cycle is required to perform the match. In the event that one of the entries "matches" the input word, the differential current flow on that word's read_write and equalization conductors will be distinctive. Of course, the actual resistance value chosen to represent logic_0 and logic_1 is arbitrary, and can be either, so long as the resistance value of the equalization cells is selected to be consistent with the operation described above. On the other hand, the power dissipation will be dependent upon the selected logic levels and will normally be minimized if selected as described above.

Figure 6:
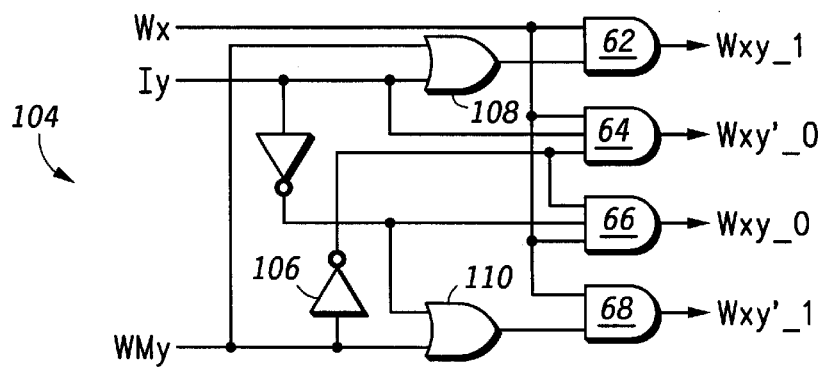
FIG. 6 illustrates in logic diagram form control logic for controlling the MRAM CAM system of FIG. 5 in performing a write operation in accordance with the present invention.

In some applications, it may be desirable during a particular series of match operations to mask or "don't care" selected bits of a stored CAM entry, thereby assuring that the masked entry will match multiple input values. Shown in FIG. 6 is a control circuit 104 adapted in accordance with a third embodiment of my invention to mask selected bits of a CAM entry at the time that entry is written into an MRAM CAM, such as those shown in FIG. 2 and FIG. 5. In general, control circuit 104 operates the same as control circuit 60 until a bit is to be masked. For example, assuming that bit_y of word_x is to be masked, a bit_y_write_mask signal, labeled "WMy", will disable, via an inverter 106, both AND 64 and AND 66, and enable both AND 62 and AND 68, via respective OR 108 and OR 110. As a result, word_x_bit_ y_write_1 driver circuit ("Wxy_1") will be enabled to write a logic_1 into bit cell Bxy, and, simultaneously, word_x_bit_y'_write_1 driver circuit ("Wxy'_1") will be enabled to write a logic_1 into bit cell Bxy' (see, e.g., FIG. 5). Since Ey, Bxy and Bxy' are all in the logic_1 state, a subsequent match operation will always result in a "match", regardless of the actual logic state of the corresponding input bit.

Figure 7:
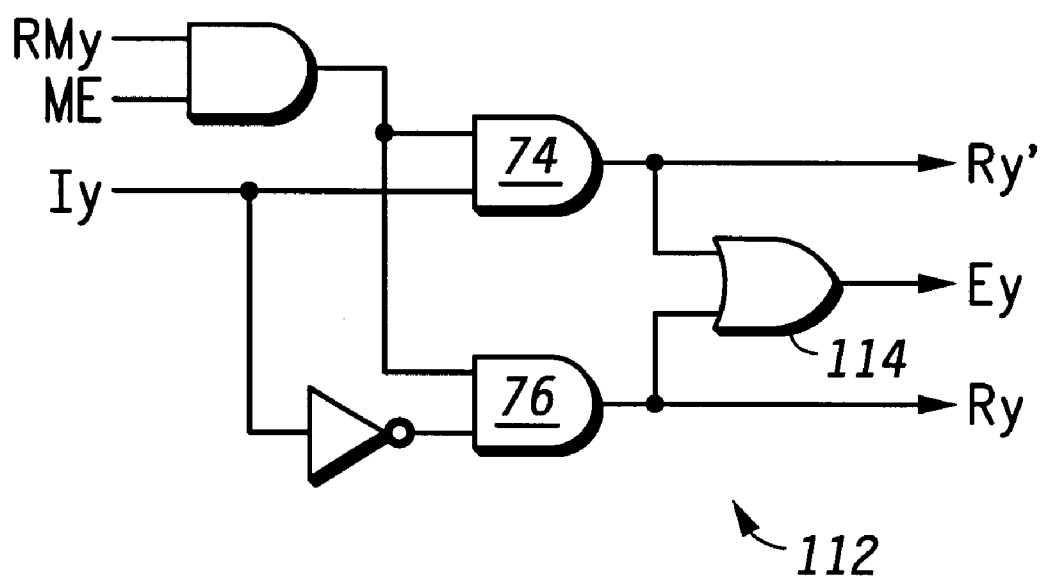
FIG. 7 illustrates in logic diagram form a control circuit according to yet another embodiment of the invention.

In other applications, it may be desirable during a particular match operation to mask or "don't care selected bits of all stored CAM entries, thereby assuring that all entries will match multiple input values. Shown in FIG. 7 is a control circuit 112 adapted in accordance with a fourth embodiment of my invention to mask selected bits of all CAM entries at the time of a match operation of an MRAM CAM, such as those shown in FIG. 2 and FIG. 5. In general, control circuit 112 operates the same as control circuit 72 until a bit of an input word is to be masked. For example, assuming that input word bit_y, labeled "Iy", is to be masked, a bit_y_read_mask signal, labeled "RMy", will disable both AND 74 and AND 76. As a result, neither the bit_y_read driver circuit ("Ry") nor the bit_y'_read driver circuit ("Ry'") will be enabled to read the respective cells Bxy and Bxy' and, by way of OR 114, Exy (see, e.g., FIG. 5).

It will be appreciated that the logical components of the several control circuits described herein can be implemented using any of the well known circuit technologies, including standard combinational logic, array logic, transmission gate logic, or a combination thereof, and that conventional logic minimization and circuit design techniques can be used advantageously to optimize circuit size, path delay, and power dissipation.

Thus it is apparent that there has been provided, in accordance with the present invention, a method for minimizing power consumption in an IC MRAM system. Those skilled in the art will recognize that modifications and variations can be made without departing from the spirit of the invention. Therefore, it is intended that this invention encompass all such variations and modifications as fall within the scope of the appended claims.

What is claimed is:

1. In an integrated circuit (IC) magnetic random access memory (MRAM) content addressable memory (CAM) system having at least one CAM cell consisting of:
   a first data bit, comprised of a first MRAM cell which is writeable in a first logic state in response to a coincidence of a word_write current and a first bit_write current provided in a first direction, and in a second logic state in response to a coincidence of said word_write current and said first bit_write current provided in a second direction; and
   a second data bit, comprised of a second MRAM cell which is writeable in said first logic state in response to a coincidence of said word_write current and a second bit_write current provided in said first direction, and in said second logic state in response to a coincidence of said word_write current and said second bit_write current provided in said second direction;
a method for writing said CAM cell, comprising the steps of:
   receiving an input bit having one of said first and second logic states;
   providing said word_write current;
   in response to receiving said input bit in said first logic state:
      providing said first bit_write current to said first MRAM cell in said first direction; and
      providing said second bit_write current to said second MRAM cell in said second direction; and
   in response to receiving said input bit in said second logic state:
      providing said first bit_write current to said first MRAM cell in said second direction; and
      providing said second bit_write current to said second MRAM cell in said first direction.

2. The method of claim 1 wherein said first MRAM cell is readable in response to a first bit_read signal having said first logic state and said second MRAM cell is readable in response to a second bit_read signal having said first logic state, further including a method for reading said CAM cell, comprising the steps of:
   receiving a compare bit having one of said first and second logic states;
   in response to receiving said compare bit in said first logic state:
      providing said first bit_read signal in said first logic state; and
      providing said second bit_read signal in said second logic state;
   in response to receiving said compare bit in said second logic state:
      providing said first bit_read signal in said second logic state; and
      providing said second bit_read signal in said first logic state; and
   sensing the logic states of said first and said second MRAM cells.

3. The method of claim 2 further comprising the step of:
   receiving a mask bit having one of said first and second logic states; and wherein, in said method for reading said CAM cell, said bit_read signals are conditionally provided only in response to receiving said mask bit in a predetermined one of said first and second logic states.

4. The method of claim 3 wherein, in said method for writing said CAM cell, said bit_write currents are conditionally provided only in response to receiving said mask bit in said predetermined one of said first and second logic states, the method for writing said CAM cell further comprising the steps of:
   in response to receiving said mask bit in the other of said first and second logic states:
      providing said first bit_write current to said first MRAM cell in said first direction; and
      providing said second bit_write current to said second MRAM cell in said first direction.

5. The method of claim 1 further comprising the steps of:
   receiving a mask bit having one of said first and second logic states; and
   in response to receiving said mask bit in a predetermined one of said first and second logic states:
      providing said first bit_write current to said first MRAM cell in said first direction; and
      providing said second bit_write current to said second MRAM cell in said first direction,
   and wherein said bit_write signals are conditionally provided only in response to receiving said mask bit in the other of said first and second logic states.

6. An integrated circuit (IC) magnetic random access memory (MRAM) content addressable memory (CAM) system having at least one CAM cell consisting of:
   a first data bit, comprised of a first MRAM cell which is writeable in a first logic state in response to a coincidence of a word_write current and a first bit_write current provided in a first direction, and in a second logic state in response to a coincidence of said word_write current and said first bit_write current provided in a second direction;

a second data bit, comprised of a second MRAM cell which is writeable in said first logic state in response to a coincidence of said word_write current and a second bit_write current provided in said first direction, and in said second logic state in response to a coincidence of said word_write current and said second bit_write current provided in said second direction; and a write control circuit comprising:
  a word_write current driver circuit which provides said word_write current;
  a first bit_write driver circuit which, in response to receiving an input bit in a first logic state, provides said first bit_write current to said first MRAM cell in said first direction, and, in response to receiving said input bit in a second logic state, provides said first bit_write current to said first MRAM cell in said second direction; and
  a second bit_write driver circuit which, in response to receiving said input bit in said first logic state, provides said second bit_write current to said first MRAM cell in said second direction, and, in response to receiving said input bit in said second logic state, provides said second bit_write current to said first MRAM cell in said first direction.

7. The circuit of claim 6 wherein said first MRAM cell is readable in response to a first bit_read signal having said first logic state and said second MRAM cell is readable in response to a second bit_read signal having said first logic state, the circuit further comprising:

a first bit_read driver circuit which, in response to receiving a compare bit in a first logic state, provides said first bit_read signal to said first MRAM cell in said first logic state, and, in response to receiving said compare bit in a second logic state, provides said first bit_read signal to said first MRAM cell in said second logic state;

a second bit_read driver circuit which, in response to receiving said compare bit in a first logic state, provides said second bit_read signal to said second MRAM cell in said second logic state, and, in response to receiving said compare bit in said second logic state, provides said second bit_read signal to said second MRAM cell in said first logic state; and a sense amplifier which senses the logic states of said first and said second MRAM cells.

8. The circuit of claim 7 wherein said bit_read driver circuits conditionally provide said bit_read signals only in response to receiving a mask bit in a predetermined one of said first and second logic states.

9. The circuit of claim 8 wherein said first bit_read driver circuit is further characterized as:

in response to receiving a mask bit in a predetermined one of first and second logic states and a compare bit in said first logic state, provides said first bit_read signal to said first MRAM cell in said first logic state, and, in response to receiving said compare bit in a second logic state, provides said first bit_read signal to said first MRAM cell in said second logic state; and in response to receiving said mask bit in the other of first and second logic states, provides said first bit_read signal to said first MRAM cell in said first logic state;

and wherein said second bit_read driver circuit is further characterized as:

in response to receiving said mask bit in said predetermined one of first and second logic states and said compare bit in said first logic state, provides said second bit_read signal to said second MRAM cell in said second logic state, and, in response to receiving said compare bit in said second logic state, provides said second bit_read signal to said second MRAM cell in said first logic state; and in response to receiving said mask bit in said other of first and second logic states, provides said second bit_read signal to said second MRAM cell in said first logic state.

10. The circuit of claim 6 wherein said first bit_write driver circuit is further characterized as:

in response to receiving a mask bit in a predetermined one of first and second logic states and said input bit in said first logic state, provides said first bit_write current to said first MRAM cell in said first direction, and, in response to receiving said input bit in a second logic state, provides said first bit_write current to said first MRAM cell in said second direction; and in response to receiving said mask bit in the other of first and second logic states, provides said first bit_write current to said first MRAM cell in said first direction;

and wherein said second bit_write driver circuit is further characterized as:

in response to receiving said mask bit in said predetermined one of first and second logic states and said input bit in said first logic state, provides said second bit_write current to said second MRAM cell in said second direction, and, in response to receiving said input bit in said second logic state, provides said second bit_write current to said second MRAM cell in said first direction; and in response to receiving said mask bit in said other of first and second logic states, provides said second bit_write current to said second MRAM cell in said first direction.

* * * * *